United States Patent
Stefanov et al.

(10) Patent No.: US 7,441,929 B2
(45) Date of Patent: Oct. 28, 2008

(54) LIGHTING UNIT HAVING A PLURALITY OF CURVED SURFACE ELEMENTS

(75) Inventors: Emil Stefanov, Altbach (DE); Thomas Luce, Esslingen (DE); Andreas Erber, Esslingen (DE); Jochen Kunze, Moers (DE)

(73) Assignee: Odelo GmbH, Esslingen (DE)

( * ) Notice: Subject to any disclaimer, the term of this patent is extended or adjusted under 35 U.S.C. 154(b) by 50 days.

(21) Appl. No.: 11/215,108

(22) Filed: Aug. 30, 2005

(65) Prior Publication Data
US 2006/0050530 A1    Mar. 9, 2006

(30) Foreign Application Priority Data
Aug. 30, 2004    (DE) ................. 10 2004 042 125

(51) Int. Cl.
*F21V 5/00*    (2006.01)
(52) U.S. Cl. .................. 362/336; 362/328; 362/309; 362/800
(58) Field of Classification Search .......... 362/291, 362/511, 522, 800, 298, 300, 328, 309; 313/512, 313/110
See application file for complete search history.

(56) References Cited
U.S. PATENT DOCUMENTS

| | | | | |
|---|---|---|---|---|
| 2,254,961 A | | 9/1941 | Harris | |
| 4,484,254 A | * | 11/1984 | Puckett et al. | 362/309 |
| 4,733,335 A | * | 3/1988 | Serizawa et al. | 362/503 |
| 5,894,196 A | * | 4/1999 | McDermott | 313/512 |
| 6,578,989 B2 | * | 6/2003 | Osumi et al. | 362/298 |
| 6,578,994 B1 | * | 6/2003 | Beyerlein | 362/490 |
| 6,607,286 B2 | * | 8/2003 | West et al. | 362/255 |
| 7,118,253 B1 | * | 10/2006 | Simon | 362/328 |
| 7,123,419 B1 | * | 10/2006 | Simon | 359/641 |
| 7,182,481 B2 | * | 2/2007 | Shimura | 362/244 |
| 2006/0050530 A1 | * | 3/2006 | Stefanov et al. | 362/602 |

\* cited by examiner

*Primary Examiner*—Anabel M Ton
(74) *Attorney, Agent, or Firm*—Laurence A. Greenberg; Werner H. Stemer; Ralph E. Locher

(57) ABSTRACT

The invention relates to a lighting unit having at least one light source and at least one light guide following the source and at least partially surrounding it, said light guide including at least one light exit surface facing away from the source and at least approximately located centrally, surrounded by at least one externally located light exit surface. In addition, at least one externally located light exit surface comprises a plurality of surface elements adjacent to each other with or without offset. These surface elements are surface regions of curved solids.

With the present invention, a compact lighting unit is developed that makes possible a uniformly high yield in a preassigned target region.

15 Claims, 3 Drawing Sheets

LIGHTING UNIT HAVING A PLURALITY OF CURVED SURFACE ELEMENTS

CROSS-REFERENCE TO RELATED APPLICATIONS

This application claims priority to German Patent Application No. 10 2004 042 125.0 filed on Aug. 30, 2004.

TECHNICAL FIELD

The invention relates to a lighting unit for use in a vehicle.

BACKGROUND OF THE INVENTION

U.S. Pat. No. 2,254,961 discloses such lighting units. These lighting units, in a target region normal to the direction of radiation from the lighting unit and illuminated by it, illuminate approximately circular zones. If a rectangular target region is to be illuminated, a large reflector is required.

The present invention, then, is addressed to the problem of developing a compact lighting unit making possible a uniformly high light yield in a prescribed target region.

SUMMARY

The invention relates to a lighting unit having at least one light source and at least one light guide following and at least partially surrounding the source, said light guide including at least one at least approximately centrally located light exit surface averted from the source and surrounded by at least one externally located light exit surface.

This stated problem is solved by the features of the principal claim. To that end, at least one externally located light exit surface comprises at least one externally located light exit surface comprising a plurality of surface elements adjoining each other with or without offsets. These surface elements are superficial regions of curved spatial bodies.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further details of the invention will emerge from the subsidiary claims and the following description of embodiments represented schematically.

DETAILED DESCRIPTION OF THE PREFERRED EMBODIMENTS

Figure 1:
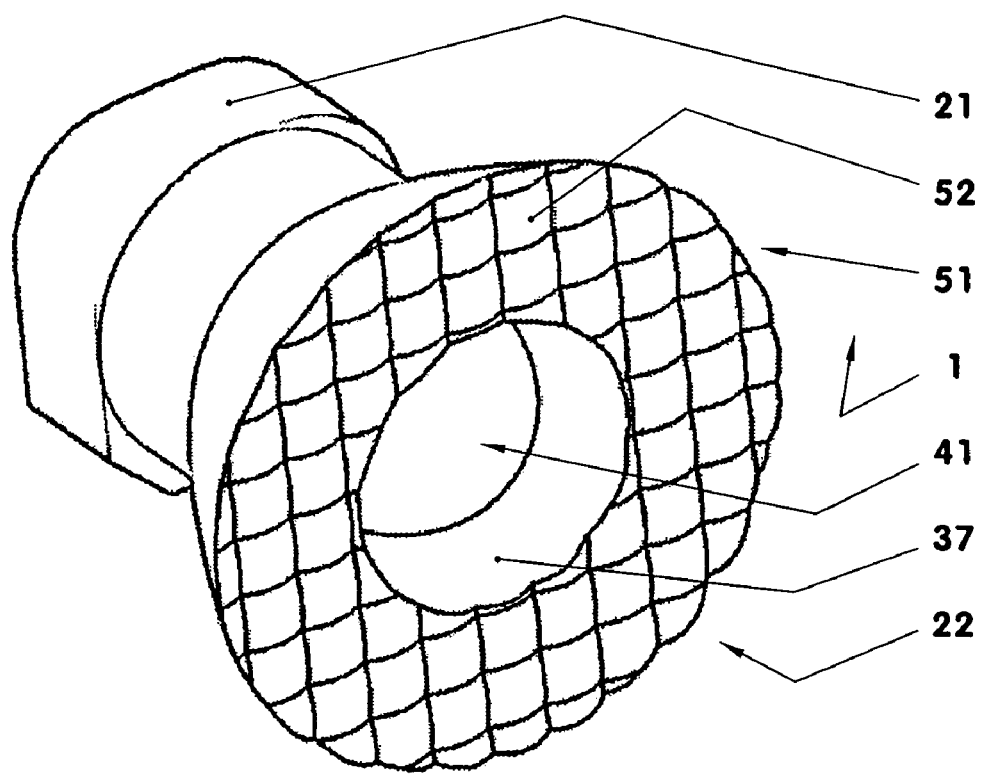
FIG. 1, dimetric view of a lighting unit.
Figure 2:
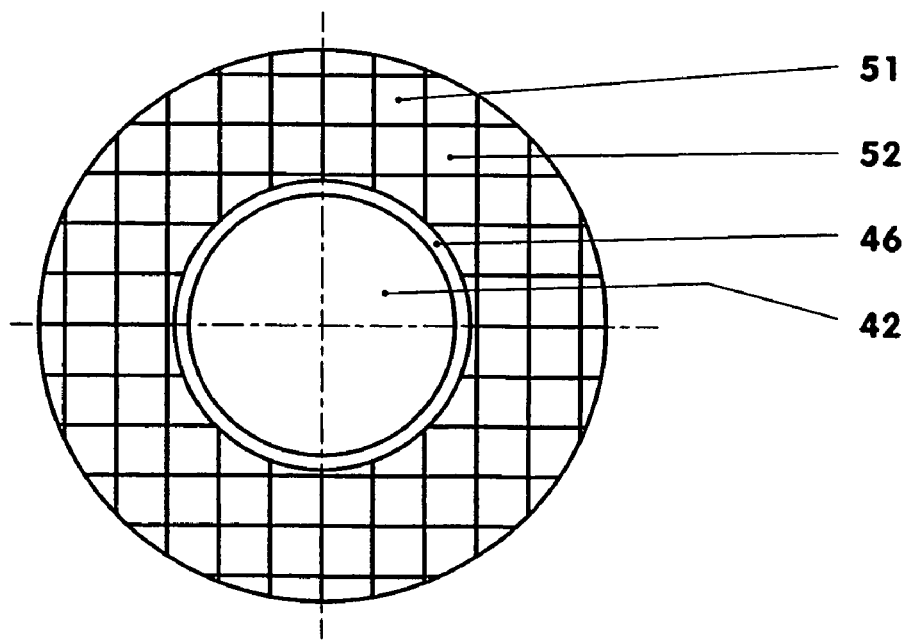
FIG. 2, front view of the lighting unit according to FIG. 1.
Figure 3:
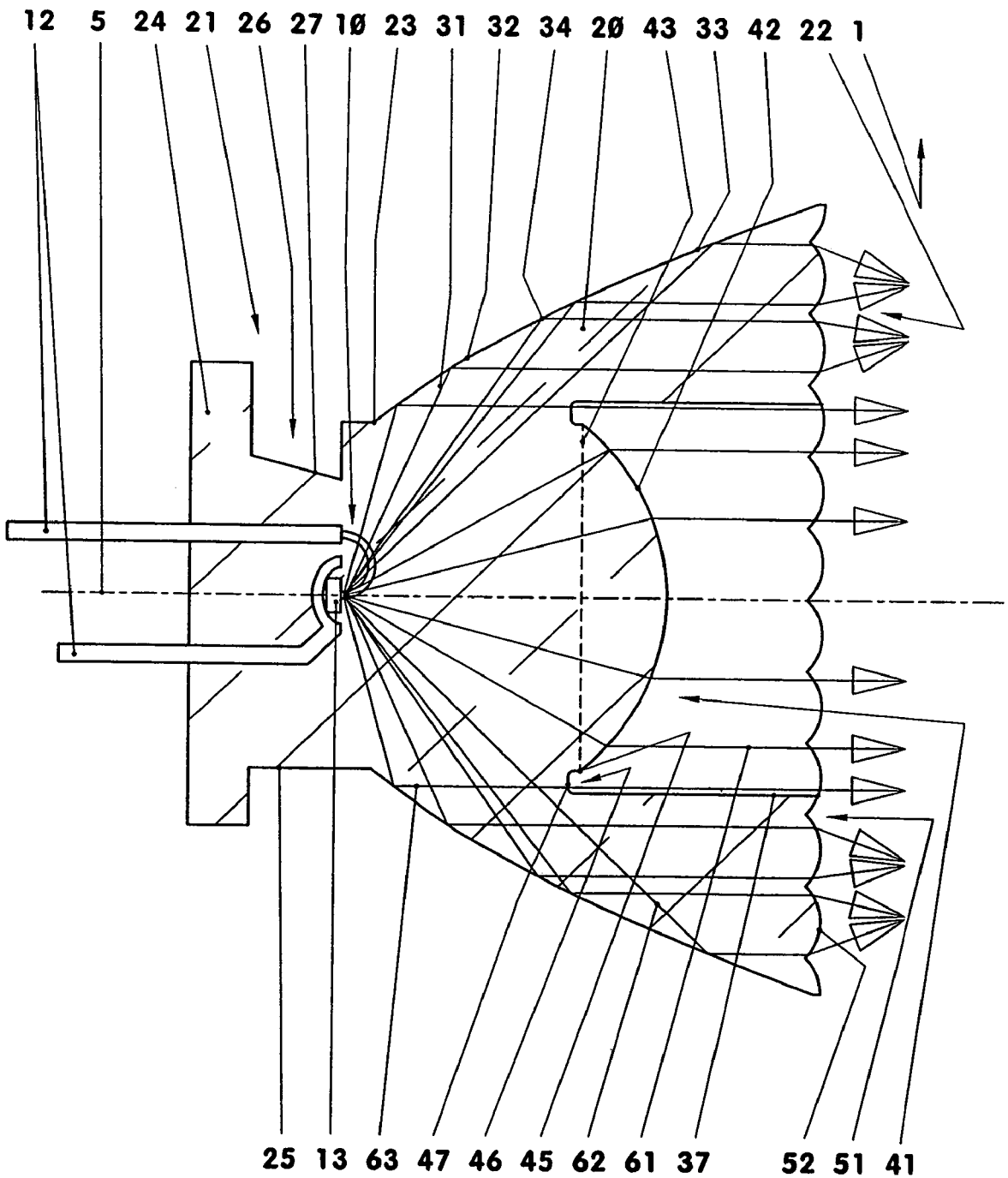
FIG. 3, section of the lighting unit according to FIG. 1.

Referring now to FIGS. 1 to 3, there is shown a dimetric representation, a front view and a longitudinal section of a lighting unit in accordance with the present invention. The lighting unit includes a light source (10) and a light guide (20) optically following the light source (10).

The light source (10) is for example a lighting diode (10). This consists for example of a light-emitting semiconductor chip (13), organic or inorganic in nature, with a layer of synthetic material cast or injected around it. To the light-emitting chip (13), electrical connections (12) are attached, projecting out of the layer of synthetic material.

Instead of a lighting diode (10), alternatively a laser diode, a halogen bulb, an incandescent bulb, etc. may be employed as light source (10).

The lighting diode (10) is surrounded by the diffuser body (20), into which the lighting diode (10) is molded e.g. by injection molding or onto which the lighting diode (10) is molded. The diffuser (20) surrounds the lighting diode (10), at least regionally.

The light guide (20) is for example a largely rotationally symmetrical object of synthetic material, e.g. PMMA, PMMI or some other optically clear thermoplastic. It has a base (21) and a segment (31) whose outside diameter increases over its length from a transition edge (23) towards a light exit side (22) facing away from the lighting diode (10). The optical axis (5) of the lighting unit coincides for example with the center line of the diffuser (20).

The base (21) has for example an attachment flange (24) adjoined by an at least regionally cylindrical segment (25). On the cylindrical segment (25), a notch (26) oriented in circumferential direction and having an oblique notch line (27) is arranged. The length of the cylindrical segment (25) may be up to half the length of the diffuser (20). Its diameter may be greater than half the maximum diameter of the diffuser (20).

The segment (31) of increasing diameter, in this embodiment by way of example, is a truncated paraboloid. This segment (31) may alternatively be a truncated hyperboloid or of some other shape. It may be of such conformity that the surface (32) has no common focus. The surface (32) may be of such configuration that the light emitted by the source (10) is totally reflected at the boundary surface (33) between the material of the diffuser (20) and the surroundings (1). In the case of PMMI, the limiting angle of total reflection is for example about 43 degrees.

The truncated paraboloid (31) is for example between 4 and 8 mm in length. The diameter range of the light exit side (22) is for example between 7 and 14 mm.

The light exit side (22) in the case of the embodiment here represented by way of example, includes a centrally located light exit surface (41), surrounded by an externally located light exit surface (51).

The central light exit surface (41) is for example the surface of an aspherical collector lens (42), arranged normal to the optical axis (5) of the lighting unit. Its diameter, at the fictive base surface (43), is about 40 percent of the diameter of the light exit side (22). The distance from the base surface (43) to the light source (10) is about 40 percent of the length of the light guide (20). This distance is greater than the distance from the base surface (43) to the focus of the collector lens (42). The base surface (43) and the surface of the collector lens (42) intersect in a boundary edge (45). This boundary edge (45) and the contour of the light-emitting chip (13) are mathematical generatrices of a body, e.g. in the special case of a cone, its opposed directrices forming for example an angle of 90 degrees.

Around the boundary edge (45), a groove (46) is arranged, as unmolding groove. The groove(46), for example over its length, has a constant cross-section. It has for example a horizontal base (47) arranged normal to the optical axis (5). In radial direction outward, the groove (46) is bounded by a hollow cylinder (37). The base (47) passes over into transitional grooves in the adjoining surfaces.

The central light exit surface (41) may alternatively be the surface of a scattering lens, a Fresnel lens, a plane lens, etc. Instead of a single optical lens (42), a plurality of optical lenses may be arranged, side-by-side for example The central light exit area (41) may comprise optical textures.

The externally located light exit surface (51) is for example likewise oriented normal to the optical axis (5). This light exit surface (51) may alternatively be inclined to the optical axis (5), conical or contoured in configuration, etc. Also, individual regions of the light exit surface (51) may exhibit different contours. Conceivably also, the light exit side (22) may include several e.g. annular light exit surfaces (51), arranged offset from each other. The center lines of these surfaces (51) then lie for example on the optical axis (5).

The externally located light exit surface (51) is divided into individual surface elements (52), arranged for example in rows and columns adjacent to each other. In the embodiment represented by way of example in FIGS. 1 to 3, the individual surface elements (52)—in front view—are square and have an edge length of a millimeter, while the surface elements (52) in the marginal regions are trimmed according to the outer contour of the diffuser (20) and the hollow cylinder (37). The light exit surface (51) of the lighting unit represented thus comprises for example 80 surface elements (52).

Instead of a Cartesian arrangement, the surface elements (52) may alternatively be located in columns or rows offset from each other; they may be arranged polarly, spirally, etc. Their surfaces may be round, triangular, rectangular, hexagonal, elliptical, etc.

The surface elements (52) shown in FIGS. 1 to 3 have for example a height between one and three tenths millimeter parallel to the optical axis (5). The height is dependent for example on the refractive index of the material of the light diffuser (20) relative to the environment (1). In the case of a high refractive index, for example, a small height will suffice; with a low refractive index, a greater height is required.

All surface elements (52) are for example surface regions of an ellipsoid. For example, they are each the same surface region of the ellipsoid. The three axes of the ellipsoid here lie normal to each other and are of different lengths, the shortest axis being about one-third the length of the longest axis and the second axis about 60 percent of the length of the longest axis. The length of the longest axis is for example 4.2 millimeters.

The corresponding axes of all imaginary ellipsoids constituting a surface element (52) are parallel to each other in this embodiment by way of example, so that all surface elements (52) are oriented in the same direction. For example, in the representation of FIG. 2, the greatest curvature of the surface elements (52) lies in a horizontal transverse plane of the lighting unit.

The surface elements (52) may also be surface regions of barrels, cylinders, cones, toruses or other arbitrarily curved bodies. They may also be surface regions of combinations of various solids. The surface elements (52) may comprise continuous or discontinuous regions, etc.

In operation of the illuminating unit, light is emitted by the lighting diode (10) in the direction of the light exit side (22). Of the light emitted by the light-emitting chip (13), here for example, for the sake of simplicity, individual rays (61 to 63) are represented. The rays (61) emitted for example within a cone having an angle of for example 45 degrees through the optical axis (5) will penetrate the homogeneous light guide diffuser (20) and be incident on the collector lens (42) at an angle between e.g. 0 degrees and 15 degrees to the normal at the point of incidence on the collector lens (42). Upon emergence from the collector lens (42), the rays (61) are so refracted for example in the direction of the optical axis (5) that the rays (61) lie at least approximately parallel to each other after emerging from the collector lens (42).

Light rays (62) emitted outside of this cone are incident at a point (34) on the surface (32) of the light guide (20). They are there reflected towards the externally located light exit surface (51). Upon passage through the surface elements (52) they are refracted from the vertical at the point of incidence. In the environment, they diverge.

Light rays (63) emitted by the source (10) at an angle of e.g. about 75 degrees to the optical axis (5) are incident on the surface (32) in the neighborhood of the transition edge (23). Here they are reflected and pass through the groove (47) into the environment (1). Other scattered light, not shown here, is reflected for example in the base (21).

If, for example, the lighting unit shown in FIG. 2 is so placed that the portion uppermost in the drawing is at the top, this lighting unit will for example approximately illuminate a rectangle whose breadth is twice as great as its height. For example, the lighting unit will illuminate a space angle region from ±20 degrees in breadth and ±10 degrees in height with high intensity.

Owing to low losses, a high light flux will reach the target region. When used for example in a motor vehicle, the distributions of intensity prescribed by applicable national laws can be maintained.

The target area to be illuminated may also be oval, elliptical, triangular, etc. To illuminate it, for example the central light exit surface (41) may comprise elements of area which are surface elements of curved bodies.

FIGS. 4 to 7 show partial sections of light exit surfaces (51).

Figure 4:
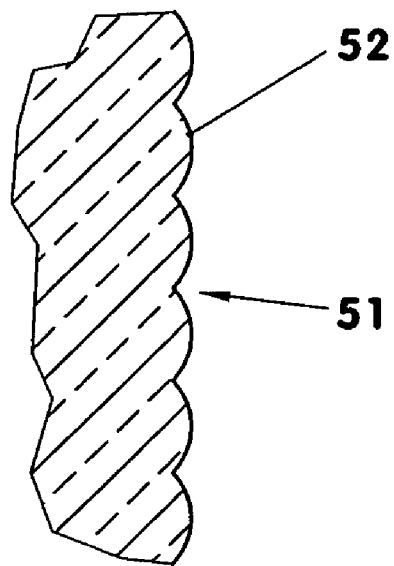
FIG. 4, partial section of a light exit surface.

In FIG. 4, the several surface elements (52) are surface elements of ellipsoids. These surface elements (52) adjoin each other without offset.

Figure 5:
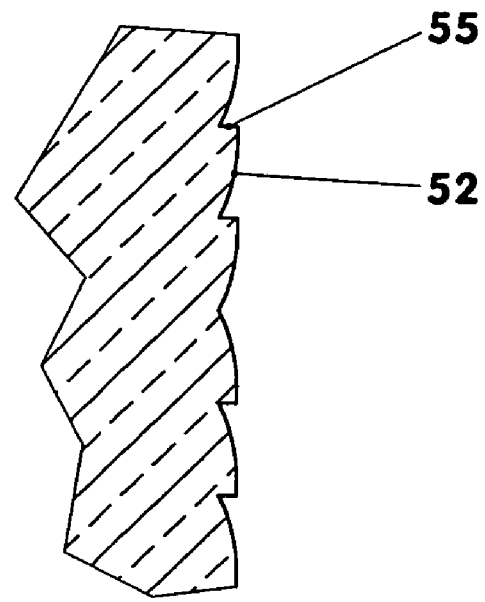
FIG. 5, partial section of a light exit surface with offset.

The light exit surface (51) represented in FIG. 5 has e.g. surface elements (52) which are surface regions of hemi-ellipsoids. The several surface elements (52) adjoin each other with offset (55). These offsets (55), in the representation of FIG. 5, point up in the upper region and down in the lower. The two middle surface elements (52) adjoin each other without offset.

Figure 6:
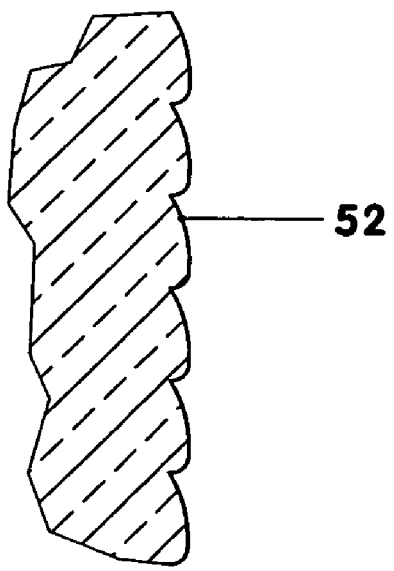
FIG. 6, partial section of a light exit surface for an asymmetrical light intensity distribution, FIG. 7, partial section of a light exit surface having different surface elements.

With the light exit surface (51) represented in FIG. 6, for example a lighting unit can be realized that illuminates an asymmetrical target region. In that case, the lighting unit would illuminate downward.

Figure 7:
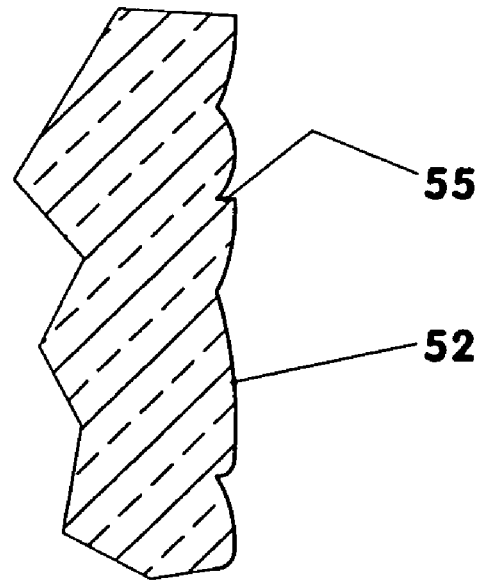

The various forms of surface elements (52) may alternatively be combined with each other, as FIG. 7 shows. The several surface elements (52) here have for example a different extent.

The lighting unit may comprise additional optical lenses optically following the central (41) and/or the externally located light exit surface (51).

The lighting unit makes possible a targeted light distribution with a compact structure. Owing to the high luminous flux in the target region, for example the brake light of a vehicle requires only a small number of lighting units.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. Lighting unit comprising:
   at least one light source;
   at least one light guide following and at least regionally surrounding the source, said light guide including at least one light exit surface facing away from the source and centrally located at least approximately, surrounded by at least one externally located light exit surface, wherein
   said at least one externally located light exit surface comprises a plurality of surface elements adjoining each other with or without offset, and
   said surface elements are surface regions of curved solids;
   said light guide including an envelope which is rotationally symmetrical with respect to an optical axis and wherein a diameter of a central light emitting surface is about 40% of the diameter of the light grid.

2. Lighting unit according to claim 1, wherein the light source is a lighting diode.

3. Lighting unit according to claim 1, wherein the single curved solid is an ellipsoid.

4. Lighting unit according to claim 1, wherein the surface elements are Cartesianally arranged.

5. Lighting unit according to claim 1, wherein all surface elements are like surface regions of the identical curved solid.

6. Lighting unit according to claim 1, wherein a central light exit surface includes an optical lens.

7. Lighting unit according to claim 1, wherein the central light exit surface comprises a plurality of surface elements adjacent to each other, which are surface regions of curved solids.

8. Lighting unit according to claim 1, wherein the light guide includes a truncated paraboloid.

9. Lighting unit comprising:
   at least one light source;
   at least one light guide following and at least regionally surrounding the source, said light guide including at least one light exit surface facing away from the source, and centrally located at least approximately surrounded by at least one externally located light exit surface, wherein said at least one externally located light exit surface comprises a plurality of surface elements Cartesianally arranged and adjoining each other with or without offset, and said surface elements are surface regions of curved solids.

10. Lighting unit comprising:
    at least one light source;
    at least one light guide following and at least regionally surrounding the source, said light guide including at least one light exit surface facing away from the source, and centrally located at least approximately surrounded by at least one externally located light exit surface, wherein said at least one externally located light exit surface comprises a plurality of surface elements adjoining each other with or without offset, and said surface elements are like surface regions of identical curved solids.

11. Lighting unit comprising:
    at least one light source;
    at least one light guide following and at least regionally surrounding the source, said light guide including at least one light exit surface facing away from the source, and centrally located at least approximately surrounded by at least one externally located light exit surface, wherein said at least one externally located light exit surface comprises a plurality of surface elements adjoining each other with or without offset, and said surface elements are surface regions of curved solids.

12. Lighting unit comprising:
    at least one light source;
    at least one light guide following and at least regionally surrounding the source, said light guide including at least one light exit surface facing away from the source and centrally located at least approximately and includes at least one optical lens, surrounded by at least one externally located light exit surface, wherein said at least one externally located light exit surface comprises a plurality of surface elements adjoining each other with or without offset, and said surface elements are surface regions of curved solids.

13. Lighting unit comprising:
    at least one light source;
    at least one light guide following and at least regionally surrounding the source, said light guide including at least one light exit surface facing away from the source, and centrally located at least approximately, surrounded by at least one externally located light exit surface, wherein said at least one externally located light exit surface comprises a plurality of surface elements adjoining each other with or without offset, and said surface elements are surface regions of curved solids, wherein said light guide includes an envelope which is rotationally symmetrical with respect to the optical axis and a diameter of a central light-emitting surface of said light guide is 40 percent of the diameter of the light guide.

14. Lighting unit comprising:
    at least one tight source;
    at least one light guide following and at least regionally surrounding the source, said light guide including a truncated paraboloid, at least one light exit surface facing away from the source, and centrally located at least approximately surrounded by at least one externally located light exit surface, wherein said at least one externally located light exit surface comprises a plurality of surface elements adjoining each other with or without offset, and said surface elements are surface regions of curved solids.

15. Lighting unit comprising:
    at least one light source;
    at least one light guide following and at least regionally surrounding the source, said light guide including at least one light exit surface facing away from the source, wherein said light exit surface is centrally located at least approximately, and said light exit surface is arranged approximately normal to an optical axis of said light source; and
    at least one externally located light exit surface surrounding said light guide, wherein said at least one externally located light exit surface comprises a plurality of surface elements adjoining each other with or without offset, and each surface elements is an ellipsoid.

* * * * *